(12) United States Patent
Watanabe et al.

(10) Patent No.: US 7,861,146 B2
(45) Date of Patent: Dec. 28, 2010

(54) VITERBI DECODING APPARATUS AND VITERBI DECODING METHOD

(75) Inventors: Kouya Watanabe, Osaka (JP); Takehiro Kamada, Osaka (JP)

(73) Assignee: Panasonic Corporation, Osaka (JP)

( * ) Notice: Subject to any disclaimer, the term of this patent is extended or adjusted under 35 U.S.C. 154(b) by 1064 days.

(21) Appl. No.: 11/597,541

(22) PCT Filed: Feb. 16, 2005

(86) PCT No.: PCT/JP2005/002292

§ 371 (c)(1),
(2), (4) Date: Nov. 27, 2006

(87) PCT Pub. No.: WO2005/117272

PCT Pub. Date: Dec. 8, 2005

(65) Prior Publication Data

US 2007/0234190 A1    Oct. 4, 2007

(30) Foreign Application Priority Data

May 27, 2004   (JP) ............................... 2004-158260

(51) Int. Cl.
*H03M 13/41* (2006.01)
(52) U.S. Cl. ..................................... 714/795
(58) Field of Classification Search .................. 714/795
See application file for complete search history.

(56) References Cited

U.S. PATENT DOCUMENTS

| | | | | |
|---|---|---|---|---|
| 5,490,178 A * | 2/1996 | Blaker et al. | ................. | 375/341 |
| 5,757,821 A * | 5/1998 | Jamal et al. | ................. | 714/746 |
| 5,944,849 A * | 8/1999 | Sonetaka | .................... | 714/786 |
| 5,983,383 A * | 11/1999 | Wolf | .......................... | 714/755 |
| 6,041,433 A | 3/2000 | Kamada | ...................... | 714/795 |
| 6,097,772 A * | 8/2000 | Johnson et al. | ............. | 375/346 |
| 6,622,280 B1 * | 9/2003 | Higashino | .................... | 714/789 |
| 6,651,215 B2 * | 11/2003 | Miyauchi et al. | ............ | 714/795 |
| 6,668,351 B1 | 12/2003 | Ikeda et al. | ................. | 714/786 |

(Continued)

FOREIGN PATENT DOCUMENTS

EP    0 924 863    6/1999

(Continued)

OTHER PUBLICATIONS

Taipale, "Implementing Viterbi Decoders Using the VSL Instruction on DSP Families DSP56300 and DSP56600", document #APR40/D, Motorola, Inc., pp. 3-11, 3-12 and 3-16 to 3-20, May 1998.*

(Continued)

*Primary Examiner*—Stephen M Baker
(74) *Attorney, Agent, or Firm*—Steptoe & Johnson LLP

(57) ABSTRACT

In a Viterbi decoding apparatus, deterioration in error correcting capability before and after a terminated code is controlled. A termination timing detection unit (103) detects a termination timing of a Viterbi code, a compulsion generation unit (105) generates a compulsion value so as to pass a specific path at the termination timing and timings before and after the termination timing, and the compulsion value is set on a traceback pointer (106). Therefore, even when the decoding state of a code before termination is degraded, decoding of a next code can be carried out without being affected by the degradation, thereby improving error correcting capability.

16 Claims, 14 Drawing Sheets

U.S. PATENT DOCUMENTS

| | | | |
|---|---|---|---|
| 6,738,941 B1* | 5/2004 | Todoroki | 714/755 |
| 7,080,307 B2* | 7/2006 | Kondo | 714/758 |
| 7,463,702 B2* | 12/2008 | Ammer et al. | 375/341 |
| 2002/0057747 A1* | 5/2002 | Kim et al. | 375/340 |
| 2006/0209995 A1* | 9/2006 | Takagi | 375/341 |

FOREIGN PATENT DOCUMENTS

| | | |
|---|---|---|
| EP | 1 071 217 | 1/2001 |
| JP | 2000-49625 | 2/2000 |
| JP | 2001-24717 | 1/2001 |
| JP | 2001-257603 | 9/2001 |
| JP | 2001-358598 | 12/2001 |
| JP | 2003-258649 | 9/2003 |
| WO | WO 01/52424 | 7/2001 |

OTHER PUBLICATIONS

Bossert, M., "Channel Coding for Telecommunications, PASSAGE," Channel Coding For Telecommunications, Chichester: John Wiley & Sons, GB, 1999, pp. 217-220.

Ming-Der Shieh et al, "Design and Implementation of a DAB Channel Decoder," IEEE Transctions on Consumer Electronics, vol. 45, No. 3, Aug. 1999, pp. 553-562.

Feygin, G. et al., "A VLSI implementation of a cascade Viterbi decoder with traceback," Proceedings of the International Symposium on Circuits and Systems, May 3-6, 1993, IEEE, vol. 2, May 3, 1993, pp. 1945-1948.

Feygin, G. et al, "Architectural Tradeoffs for Survivor Sequence Memory Management in Viterbi Decoders," IEEE Transactions on Communications, vol. 41, No. 3, Mar. 1993, pp. 425-429.

* cited by examiner

Fig.2(b)
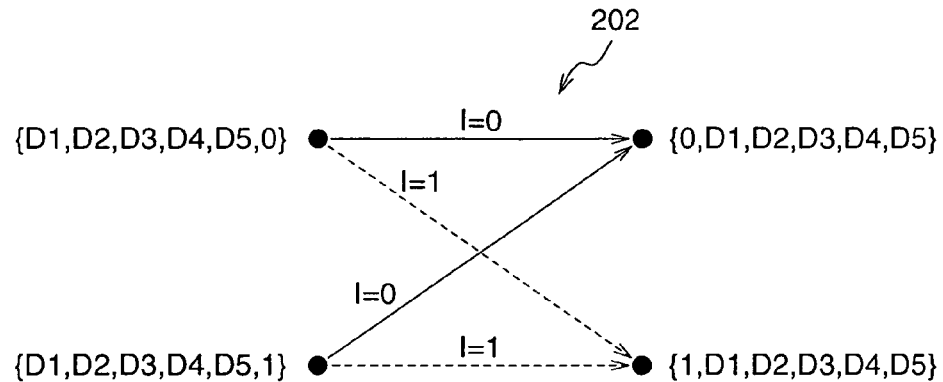
Fig.3
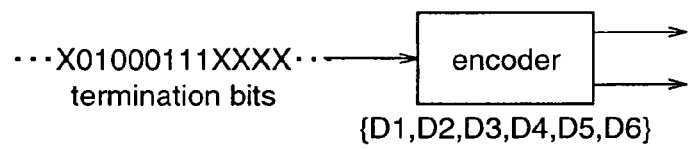
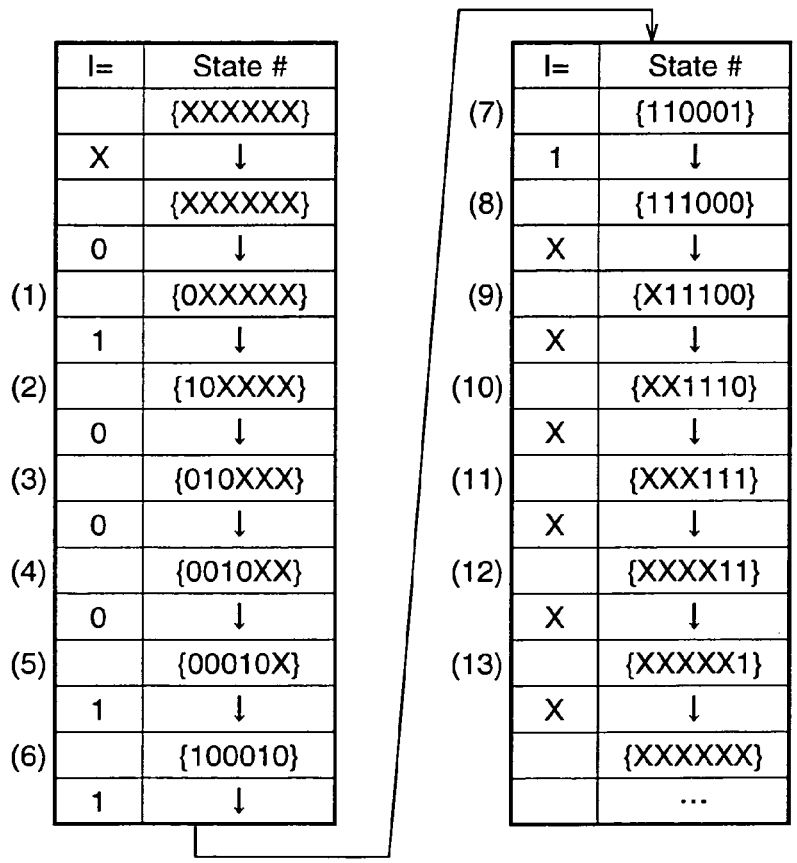

US 7,861,146 B2

VITERBI DECODING APPARATUS AND VITERBI DECODING METHOD

CLAIM OF PRIORITY

This application claims priority under 35 USC 371 to International Application No. PCT/JP2005/002292, filed on Feb. 16, 2005, which claims priority to Japanese Patent Application No. 2004-158260, filed on May 27, 2004, each of which is incorporated by reference in its entirety.

TECHNICAL FIELD

The present invention relates to a Viterbi decoding apparatus and a Viterbi decoding method for subjecting data transmitted by using convolution codes to error correction using Viterbi decoding.

BACKGROUND ART

As for a digital transmission system for transmitting data using convolution codes and performing error correction using Viterbi decoding at a receiving end, there has been a well-known technique in which a code sequence is terminated with a certain termination code so that a plurality of data to be coded, which are not related to each other at all, are connected to be treated as one code sequence, thereby enabling continuous decoding by a single decoder.

Hereinafter, a signal that is convolutionally coded by a convolution encoder 201 shown in FIG. 2(a) is regarded as a target. As shown in FIG. 2(a), the convolution encoder 201 stores successively inputted information bits I into shift registers D1~D6, respectively, and two code bits C0 and C1 are generated from the previously inputted six information bits and the currently inputted information bit I. To be specific, $C0=D6 \oplus D2 \oplus D1 \oplus I$ $C1=D6 \oplus D5 \oplus D2 \oplus I$ are generated. These are expressed by a trellis diagram 202 shown in FIG. 2(b). Hereinafter, the values of D1~D6 are denoted by STATE{D1,D2,D3,D4,D5,D6}.

Generally, among bit sequences inputted to an encoder, a code sequence of a specific order is treated as termination bits to be used for a termination process. Hereinafter, a description will be given of a case where termination is performed with a code sequence in which termination bits are inputted in order of 01000111 as shown in FIG. 3.

It is assumed that the termination bits 01000111 are sequentially inputted to the convolution encoder 201 shown in FIG. 2(a). Since the bits before and after the termination bits can be 0 and 1, these bits are represented by X.

When 0 at the top of the termination bits 01000111 is inputted to the encoder, the STATE is {XXXXXX}. When the termination bits 01000111 are sequentially inputted from this state, as shown in FIG. 3, the value of the STATE transits as follows:

{XXXXXX}→(1){1XXXXX}→(2){10XXXX}→(3){010XXX}→(4){0010XX}→(5){00010X}→(6){100010}→(7){110001}→(8){→111000}→(9){X11100}→(10){XX1110}→(11){XXX111}→(12){XXXX11}→(13){XXXXX1}→(14){XXXXXX}→...

and convolution codes are generated by the respective values of STATE and the values of the input bits.

Presuming that thus encoded codes are inputted to a decoder without being affected by a transmission path, nodes of a trellis diagram in traceback at decoding should transit in the order of (13)~(1) that is reverse to the order at coding.

Based on such characteristics, there have been proposed several techniques for preventing deterioration in error correcting capability before and after the termination process. As a typical prior art, there is a technique of controlling a value of a path metric corresponding to STATE of a peculiar node to 0 or MAX at a timing of any of the above-mentioned STATE (6)~(8) on the basis of positional information of a termination code in an ACS (Add Compare Select) circuit, thereby to improve error correcting capability (for example, refer to Japanese Published Patent Application No. 2000-183756 (Patent Document 1)).

DISCLOSURE OF THE INVENTION

Problems to be Solved by the Invention

However, when the above-mentioned technique is adopted, it is necessary to control the values of several tens of registers which hold path metrics each comprising several bits, to 0 or MAX, and increase in the scale of the control circuit is negligible. Further, a system with a termination value being variable causes further increase in the circuit scale. Accordingly, reduction in circuit scale and further improvement in performance become challenges.

The present invention is made to solve the above-mentioned problems and has for its object to prevent propagation of deterioration in error correcting capability before and after a termination code without inviting an increase in the circuit scale, and achieve further improvement in error correcting capability.

Measures to Solve the Problems

In order to solve the above-mentioned problems, according to the invention of claim 1, there is provided a Viterbi decoding apparatus for decoding a convolution code that is terminated by a predetermined termination value, comprising an ACS means for generating a branch metric from an inputted code to generate a path metric and a path selection signal at each node; a traceback memory for storing the path selection signal outputted from the ACS means; a termination timing detection means for detecting a termination timing of the inputted code, and outputting a termination control signal for controlling a traceback process to be performed to the traceback memory; and a traceback unit for receiving the path selection signal outputted from the traceback memory, and the termination control signal, and performing the traceback process using a pointer for traceback; and the traceback unit sets a compulsion value based on the termination value to the pointer, independently of the path selection signal, when the termination control signal indicates a termination processing period.

Therefore, it is possible to prevent propagation of deterioration in error correcting capability before and after a termination code without inviting a significant increase in circuit scale, resulting in further improvement in error correcting capability.

According to the invention of claim 1, in the Viterbi decoding apparatus defined in claim 1, the traceback unit accesses the traceback memory at a reading rate that is M (M: integer not less than 2) times as high as a writing rate of the inputted code to perform the traceback process.

Therefore, it is possible to prevent propagation of deterioration in error correcting capability before and after a termination code without inviting a significant increase in circuit scale, resulting in further improvement in error correcting capability.

According to the invention of claim 3, in the Viterbi decoding apparatus as defined in claim 1, the traceback memory comprises a plurality of banks; the traceback unit performs the traceback process by a pipeline processing, using the traceback memory that is divided into the plural banks; when the termination value is separated into two banks, the termination timing detection means detects termination code periods of the two banks or a termination code period of one of the two banks; and the traceback unit sets the compulsion value based on the termination value to the pointer, in the two termination code periods or in the one of the two termination code periods, thereby performing the traceback process.

Therefore, it is possible to prevent propagation of deterioration in error correcting capability before and after a termination code without inviting a significant increase in circuit scale, resulting in further improvement in error correcting capability.

According to the invention of claim 4, in the Viterbi decoding apparatus defined in claim 1 or 3, the termination timing detection means includes a counter means for performing counting every time code data is inputted, and obtains the termination code period by calculation from a counter value of the counter means, at a timing when the convolution code terminated with a predetermined termination value is written into the traceback memory; and the traceback unit sets a compulsion value based on the termination value to the pointer in the detected termination code period, thereby performing the traceback process.

Therefore, it is possible to prevent propagation of deterioration in error correcting capability before and after a termination code without inviting a significant increase in circuit scale, resulting in further improvement in error correcting capability.

According to the invention of claim 5, in the Viterbi decoding apparatus defined in claim 3, the termination timing detection means includes a counter means that performs counting every time code data is inputted, and a termination period division detection means for detecting that the termination code period is divided into two periods, on the basis of a traceback start signal and a termination code signal, and obtains the one termination code period or the termination code period that is detected as being divided into two periods, by calculation from a counter value of the counter means, at a timing when a convolution code terminated with a predetermined termination value is written into the traceback memory; and the traceback means sets a compulsion value based on the termination value to the pointer in the detected termination code period.

Therefore, it is possible to prevent propagation of deterioration in error correcting capability before and after a termination code without inviting a significant increase in circuit scale, resulting in further improvement in error correcting capability.

According to the invention of claim 6, in the Viterbi decoding apparatus defined in claim 3, the termination timing detection means includes one address storage means for storing an address for writing a head value of the convolution code terminated with a predetermined termination value into the traceback memory, and compares the stored write address with an address for reading the traceback memory to detect the termination processing period; and the traceback means sets a compulsion value based on the termination value to the pointer, in the detected termination code period.

Therefore, it is possible to prevent propagation of deterioration in error correcting capability before and after a termination code without inviting a significant increase in circuit scale, resulting in further improvement in error correcting capability.

According to the invention of claim 7, in the Viterbi decoding apparatus defined in claim 3, the termination timing detection means includes an address storage means that stores, when the termination period is separated into two banks, an address for writing a head value of the termination code in the first bank, an address storage means that stores an address for writing a last value of the termination code in the first bank, an address storage means that stores an address for writing a head value of the termination code in the second bank, an address storage means that stores an address for writing a last value of the termination code in the second bank, and an address comparison means for comparing the stored write addresses with the address for reading the traceback memory to detect the termination processing period; and the traceback unit sets a compulsion value based on the termination value to the pointer in the detected termination code period.

Therefore, it is possible to prevent propagation of deterioration in error correcting capability before and after a termination code without inviting a significant increase in circuit scale, resulting in further improvement in error correcting capability.

According to the invention of claim 8, in the Viterbi decoding apparatus defined in claim 3, addresses for traceback start and end in the traceback memory are fixed; the termination timing detection means includes an address storage means that stores an address for writing a head value of the termination code in the first bank, an address storage means that stores an address for writing a head value of the termination code in the second bank, and an address comparison means for comparing the stored write addresses with an address for reading the traceback memory to detect the termination processing period; and the traceback unit sets a compulsion value based on the termination value to the pointer in the detected period.

Therefore, it is possible to prevent propagation of deterioration in error correcting capability before and after a termination code without inviting a significant increase in circuit scale, resulting in further improvement in error correcting capability.

According to the invention of claim 9, in the Viterbi decoding apparatus defined in claim 2 or 3, the termination timing detection means includes means for writing, into the traceback memory, 1-bit judgment data indicating that the convolution code terminated with a predetermined terminal value is a termination code, together with the convolution code, when the convolution code is written in the traceback memory, means for reading the judgment data simultaneously with the convolution code, and means for judging the termination period using the judgment data; and the traceback unit sets a compulsion value based on the termination value to the pointer in the detected period.

Therefore, it is possible to prevent propagation of deterioration in error correcting capability before and after a termination code without inviting a significant increase in circuit scale, resulting in further improvement in error correcting capability.

According to the invention of claim 10, in the Viterbi decoding apparatus defined in claim 2 or 3, the termination timing detection means includes means for writing, into the traceback memory, judgment data comprising plural bits which indicates the termination state of the convolution code terminated with a predetermined terminal value, together with the convolution code, when the convolution code is written in the traceback memory, and means for reading the judgment data simultaneously with the convolution code from the traceback memory; and the traceback unit sets a compulsion value based on the termination value to the pointer at a timing when the judgment data is read.

Therefore, it is possible to prevent propagation of deterioration in error correcting capability before and after a termination code without inviting a significant increase in circuit scale, resulting in further improvement in error correcting capability.

According to the invention of claim 11, the Viterbi decoding apparatus defined in any of claims 1 to 10 further includes means for setting, when a code sequence in which a termination value is variable is inputted, a variable value according to the termination value as a compulsion value; and the traceback unit compulsorily sets the compulsion value according to the variable termination value on the traceback pointer, when the termination timing detection means detects the termination period.

Therefore, it is possible to prevent propagation of deterioration in error correcting capability before and after a termination code without inviting a significant increase in circuit scale, resulting in further improvement in error correcting capability.

According to the invention of claim 12, the Viterbi decoding apparatus defined in any of claims 1 to 11 includes the traceback pointer comprising an FIFO (First In First Out), and means for inputting a compulsion value as input bits to the FIFO independently of the path selection signal, during the termination processing period detected by the termination timing detection means; and the traceback unit sets a compulsion value based on the termination value to the pointer.

Therefore, it is possible to prevent propagation of deterioration in error correcting capability before and after a termination code without inviting a significant increase in circuit scale, resulting in further improvement in error correcting capability.

According to the invention of claim 13, in the Viterbi decoding apparatus defined in any of claims 1 to 12, the termination period detection means detects and outputs only a partial period in a detected termination processing period or in a detected termination processing period that is divided into two periods; and the traceback unit sets a compulsion value on the traceback pointer only in the partial period.

Therefore, it is possible to prevent propagation of deterioration in error correcting capability before and after a termination code without inviting a significant increase in circuit scale, resulting in further improvement in error correcting capability.

According to the invention of claim 14, there is provided a Viterbi decoding method for decoding a convolution code that is terminated with a predetermined termination value, wherein when performing traceback on codes before and after the terminated code, a compulsion value based on the termination value is set on a traceback pointer regardless of a result of actual traceback.

Therefore, it is possible to prevent propagation of deterioration in error correcting capability before and after a termination code without inviting a significant increase in circuit scale, resulting in further improvement in error correcting capability.

Effects of the Invention

As described above, according to the Viterbi decoding apparatus and the Viterbi decoding method of the present invention, a termination timing in a convolution code that is terminated with a predetermined termination value is detected, and a compulsion value obtained from the termination value is given to the traceback pointer in accordance with a read timing of the traceback memory from the termination timing. Therefore, it is possible to prevent propagation of deterioration in error correcting capability before and after a termination code without inviting a significant increase in circuit scale.

BRIEF DESCRIPTION OF THE DRAWINGS

FIG. 2(*b*) is a trellis diagram of the convolution encoder according to the first to fifth embodiments of the present invention.

FIG. 3 is a flowchart for explaining the convolution encoder according to the first to fifth embodiments of the present invention.

DESCRIPTION OF THE REFERENCE NUMERALS

Figure 1:
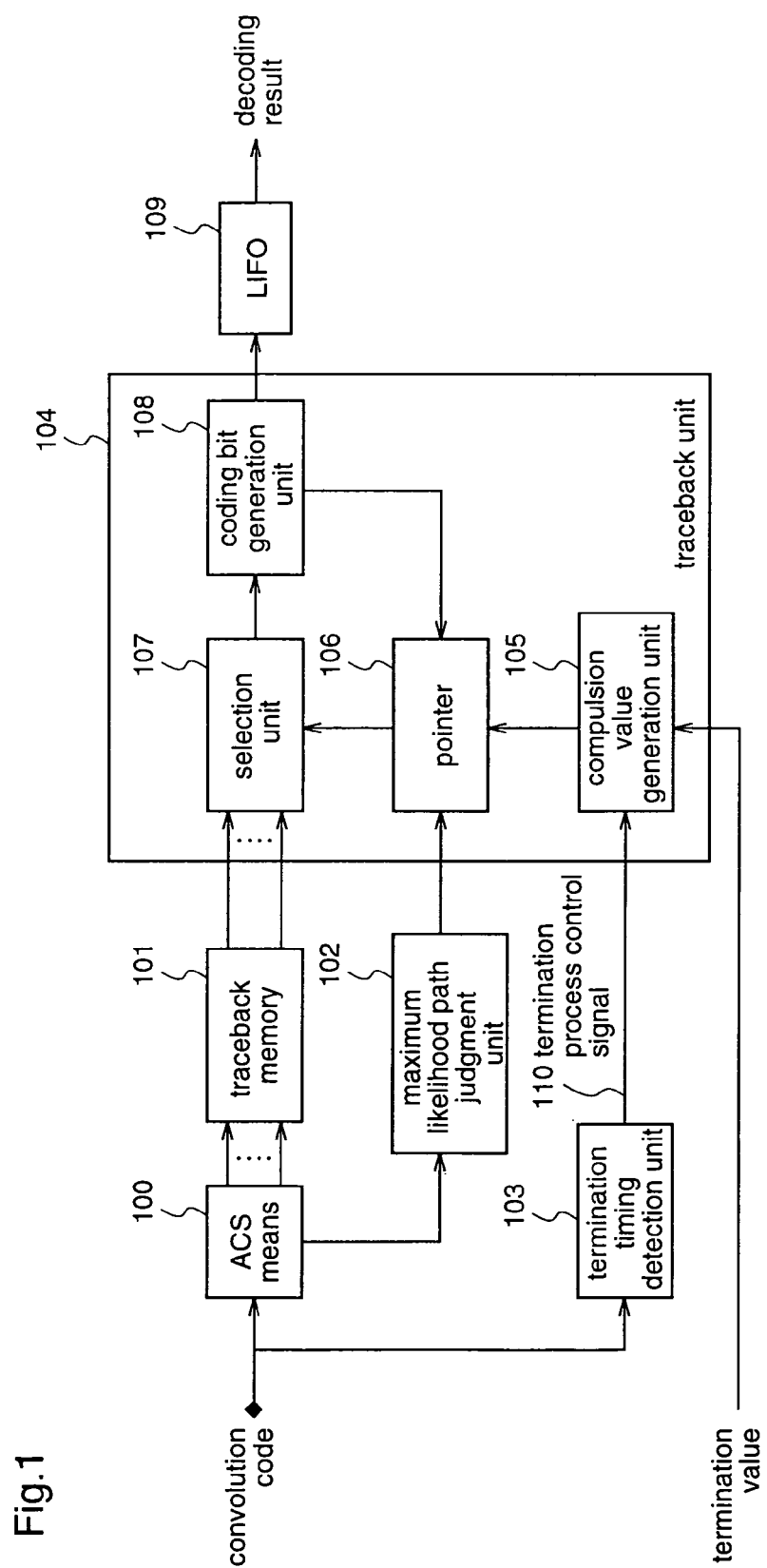
FIG. 1 is a block diagram of a Viterbi decoding apparatus according to first to fifth embodiments of the present invention.

100 . . . ACS means
101 . . . traceback memory
102 . . . maximum likelihood path judgment unit
103 . . . termination timing detection unit
104 . . . traceback unit
105 . . . compulsion value generation unit 106 . . . pointer
107 . . . selection unit
108 . . . coding bit generation unit
109 . . . LIFO
110 . . . termination process control signal
500 . . . traceback start signal
501 . . . termination period end signal
502 . . . termination code signal
503 . . . counter A
504 . . . counter B
505 . . . processing mode detection unit
803 . . . termination timing detection unit
800 . . . termination period division detection unit
810 . . . termination process control signal
1200 . . . address storage unit A
1201 . . . address storage unit B
1202 . . . address storage unit C
1203 . . . address storage unit D
1204 . . . address comparison unit
1205 . . . traceback memory address
1213 . . . termination timing detection unit
1210 . . . termination process control signal
1215 . . . processing mode detection unit
1300 . . . bit expansion
1301 . . . termination information bit writing
1302 . . . termination information bit reading

BEST MODE TO EXECUTE THE INVENTION

Embodiment 1

Hereinafter, a first embodiment of the present invention will be described with reference to the drawings.

FIG. 1 is a block diagram illustrating the construction of a Viterbi decoding apparatus according to the first embodiment of the present invention. The Viterbi decoding apparatus shown in FIG. 1 decodes a terminated convolution code.

With reference to FIG. 1, an ACS unit 100 generate branch metrics from an inputted convolution code, and generates path metrics and path selection signals at the respective nodes from the generated branch metrics.

A traceback memory 101 stores the path selection signals outputted from the ACS unit 100. For example, it is constituted by an ordinary RAM (Random Access Memory).

A maximum likelihood path judgment unit 102 judges a maximum likelihood path on the basis of the path metrics and the path selection signals outputted from the ACS unit 100.

A termination timing detection unit 103 detects a termination processing period of the inputted code when it is traced back, on the basis of a signal indicating that the inputted convolution code is a termination code, and outputs a termination control signal 110 for controlling the traceback process.

A traceback unit 104 receives the path selection signals outputted from the traceback memory 101, the termination control signal, and a termination value, and performs traceback using a pointer for traceback.

The traceback unit 104 comprises a compulsion value generation unit 105 for generating a compulsion value to be input to a pointer unit 106 on the basis of the termination control signal 110 outputted from the termination timing detection unit 103 and the variable termination value, a pointer unit 106 comprising an FIFO (First In First Out memory) which receives the maximum likelihood path outputted from the maximum likelihood path judgment unit 102, a code outputted from a coding bit generation unit 108, and the compulsion value outputted from the compulsion value generation unit 105, and outputs a pointer for performing traceback, a selection unit 107 for reading a maximum likelihood path selection signal from the traceback memory 101 using the pointer outputted from the pointer unit 106, and a coding bit generation unit 108 for generating coding bits from the path selection signal outputted from the selection unit 107.

A LIFO (Last In First Out memory) 109 holds the coding bit outputted from the traceback unit 104, and outputs a result of decoding.

Hereinafter, a description will be given of the operation of the Viterbi decoding apparatus of the first embodiment constituted as described above.

The Viterbi decoding apparatus judges a signal which indicates whether the code being inputted is a termination code or not, and performs a traceback process similar to that of the conventional Viterbi decoding apparatus when the inputted convolution code is not a termination code (for example, refer to Japanese Published Patent Application No. Hei.9-191258 (Patent Document 2)).

Hereinafter, the traceback process similar to the conventional one will be briefly described in association with the construction of the circuit of the present invention. The ACS unit 100 generates branch metrics on the basis of the inputted convolution code, and further, selects paths that reach the respective nodes of the trellis diagram using the branch metrics, thereby updating the path metrics and the path selection signals corresponding to the respective nodes. The path selection signals are stored in the traceback memory 101.

Simultaneously with the above-mentioned process, the maximum likelihood path judgment unit 102 compares the path metrics corresponding to the respective nodes, thereby to select one of higher likelihood. The result of judgment by the maximum likelihood judgment unit 102 is given as a pointer value of the pointer unit 106 at a timing when traceback is started in the traceback unit 104.

In the traceback unit 104, a node that is referred by the pointer value given by the maximum likelihood path judgment unit 102 as described above is selected by the selection unit 107 at the traceback start point, and the path selection signal at the node indicated by this pointer is read from the traceback memory 101 to be input to the coding bit generation unit 108. A code generated by the coding bit generation unit 108 is inputted to the LIFO 109, and simultaneously, it is inputted to the pointer unit 107 to be used for pointer updation.

Figure 2A:
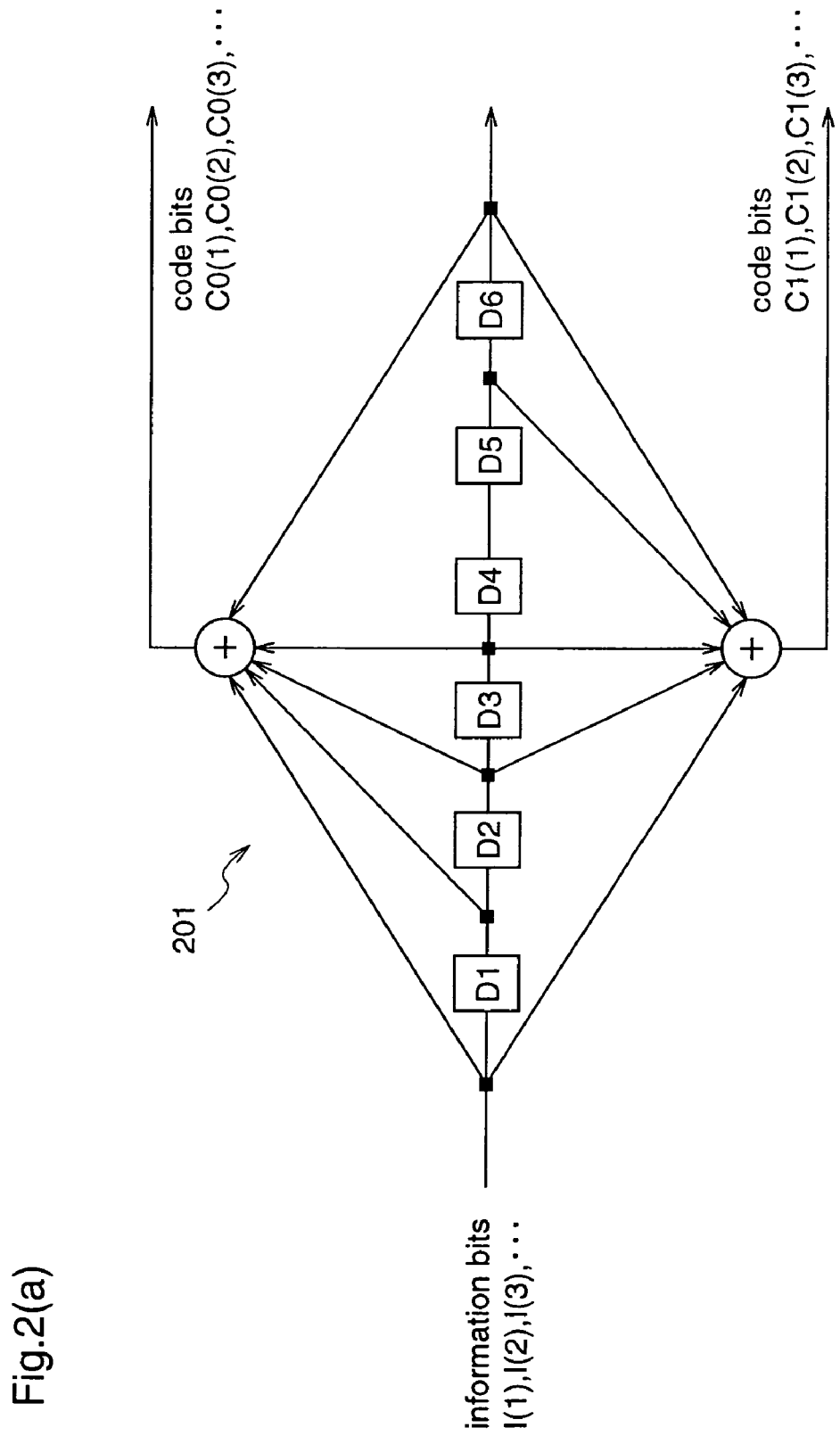
FIG. 2(*a*) is a block diagram of a convolution encoder according to the first to fifth embodiments of the present invention.

In the case where the code shown in FIG. 2 is adopted, the pointer unit 106 is constituted by a FIFO to which the path selection signals are sequentially inputted. Generally, a pointer value is obtained by an arithmetic operation or a table from the path selection signals on the basis of a polynomial expression for code generation. The code inputted to the LIFO 109 is outputted as decoded data after the traceback is ended. Through the above-mentioned processes, the convolution code is decoded.

Hereinafter, a description will be given of a process in the case where the inputted convolution code is a termination code, in the decoding apparatus having the above-mentioned functions.

It is premised that the variable termination value is 01000111.

Assuming that the code sequence is inputted to the decoder without being affected by the transmission path at all, when this code is traced back, the nodes of the trellis diagram should transit in the order reverse to the transition of the STATE values at coding shown in FIG. 3, as follows:

(14){XXXXXX}→(13){XXXXX1}→(12){XXXX11}→(11){XXX111}→(10){XX1110}→(9){X11100}→(8){111000}→(7){110001}→(6){100010}→(5){00010X}→(4){0010XX}→(3){010XXX}→(2){10XXXX}→(1){0XXXXX}→{XXXXXX}→...

In the actual system, however, since the transmitted signal is adversely affected by noise in the transmission path, the signal coded by the encoder is not identical to the input signal to the decoder, leading to a possibility that the path metrics and the path selection signals obtained in the ACS circuit 100 may have values different from ideal values.

In the first embodiment of the invention, when a termination code is inputted, the termination timing detection unit 103 detects the times of (13)~(1) in which the inputted termination code is traced back to output a termination process control signal 110, and the compulsion value generation unit 105 generates a compulsion value without using the path selection signals taken out of the traceback memory 101 so that the termination code is led to the ideal STATE at the times determined by the termination value, and then the pointer unit 106 performs track back using the compulsion value.

Figure 4:
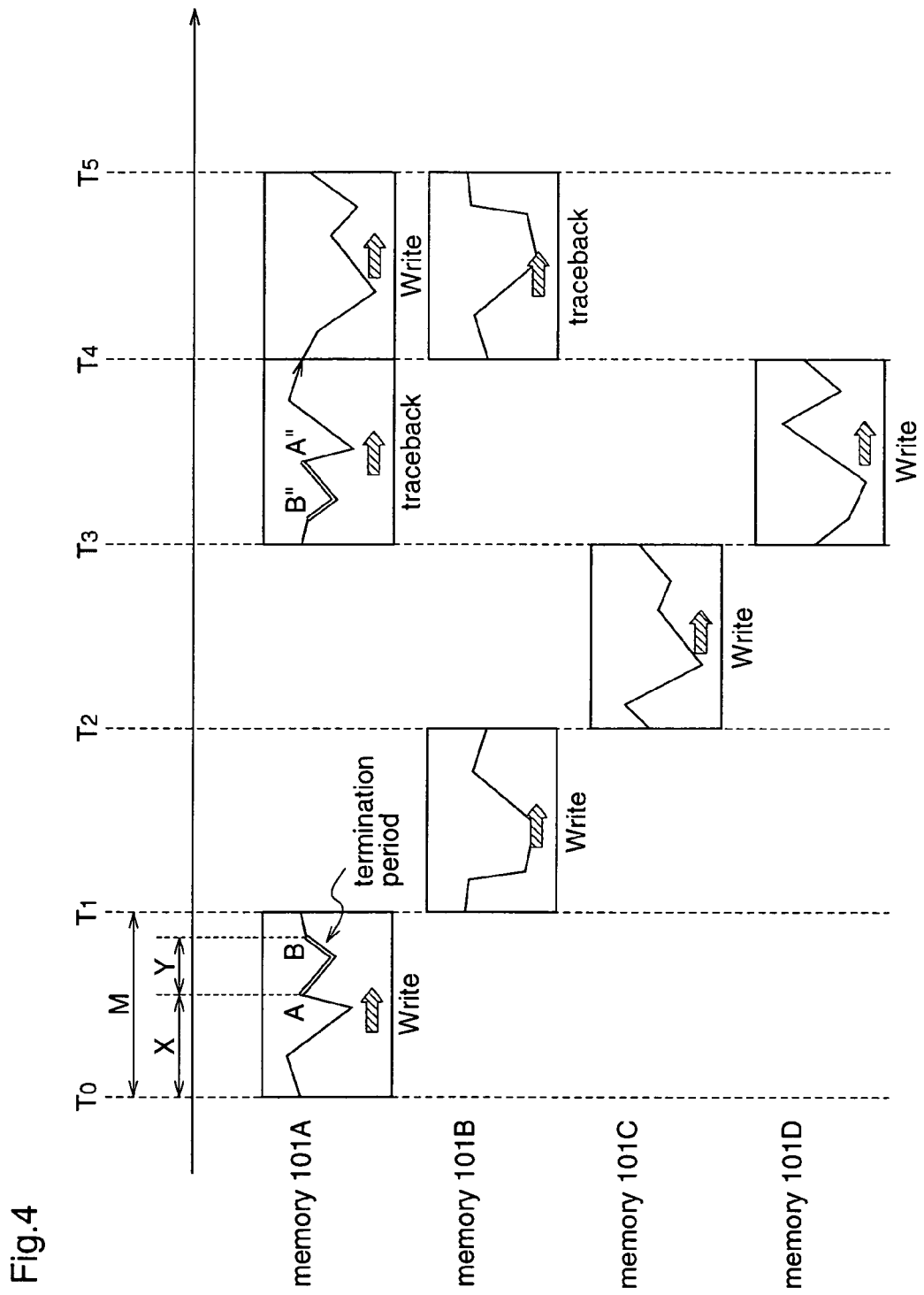
FIG. 4 is a conceptual diagram of a traceback process according to the first embodiment of the present invention.

With reference to FIG. 4, a description will be given of the times at which the inputted code sequence is traced back. The times are values regulated with a symbol rate f.

In FIG. 4, the intervals of the respective times T0, T1, T2, T3, T4, T5 correspond to the time intervals for inputting or outputting M pieces of path selection signals in/from the traceback memory 101.

As shown in FIG. 4, at time T0~T1−1, M pieces of path selection signals are stored in the memory 101A, and thereafter, M pieces of path selection signals are successively stored in the memory 101B at time T1~T2−1, in the memory 101C at time T2~T3−1, in the memory 101D at time T3~T4−1, and again in the memory 101A at time T4~T5−1.

The path selection signals stored in the memory 101A at time T0~T1−1 are read out at time T3~T4−1 in the order reverse to the storing order. That is, the path selection signals stored at time T1−1 are taken out at time T3, and the path selection signals stored at time T0 are taken out at time T4−1.

It is considered that, in this decoding apparatus, a termination code is inputted during a period of time T0~T1−1 as shown in FIG. 4. Assuming that the times A and B at which the head and the end of this terminal code sequence are stored are T0+X and T0+X+Y, respectively, the times A" and B" at which they are taken out are T4−X and T4−X−Y, respectively. That is, the head of the termination code is taken out after Ta=T4−X−T0=4M−X with T0 as a basis, and the end of the termination code is taken out after Tb=T4−X−Y−T0=4M−X−Y. Since M is determined by the traceback length and Y denotes the number of termination code bits N−1 which is a fixed value for the system, the times at which the path selection signals of the termination code are taken out can be detected if only X is obtained.

In this first embodiment, the termination timing detection unit 103 detects the times at which the path selection signals of the termination code are taken out, and generates a termination process control signal 110 to be outputted to the compulsion value generation unit 105.

Figure 5:
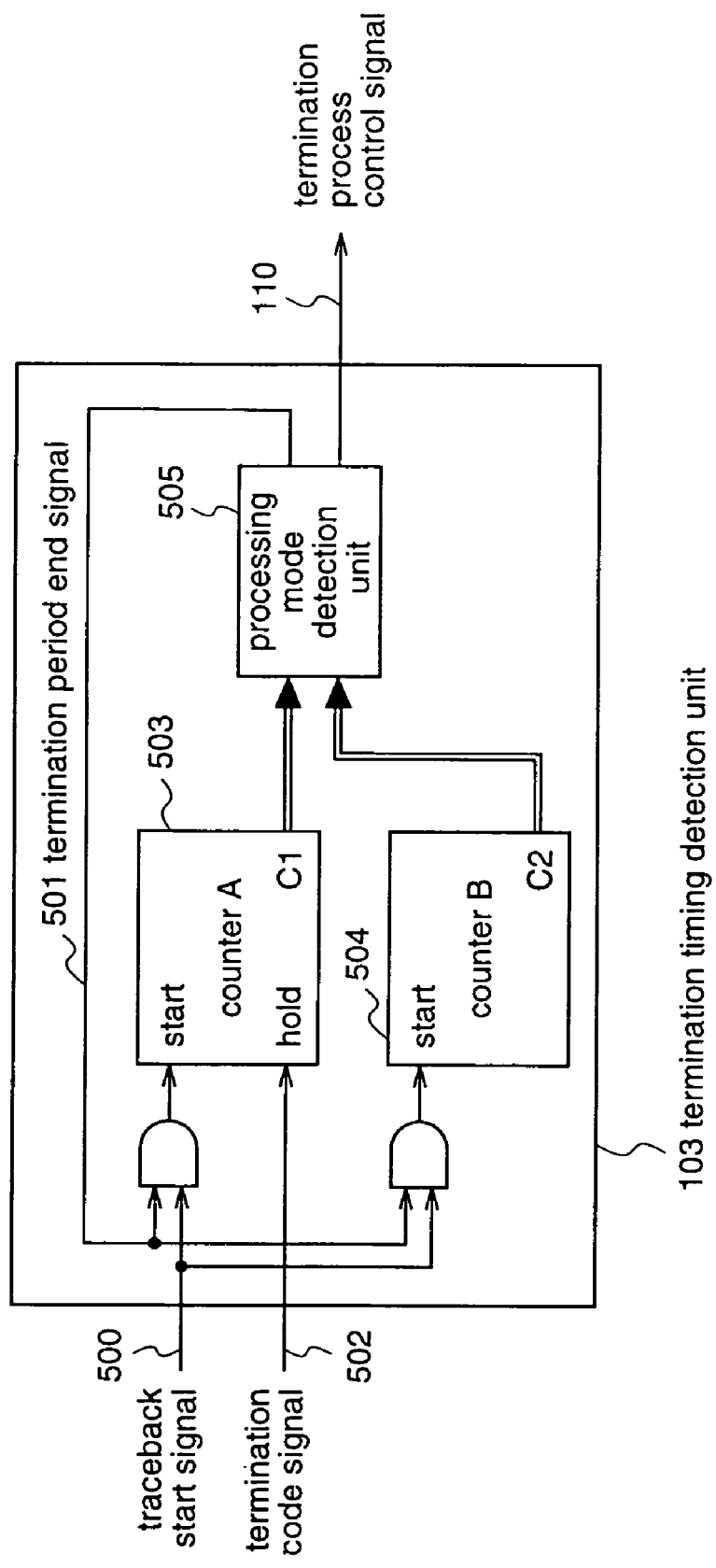
FIG. 5 is a block diagram of a termination timing detection unit according to the first embodiment of the present invention.

FIG. 5 is a block diagram of the termination timing detection unit 103 according to the first embodiment.

The ACS unit 100 generates branch metrics from an inputted convolution code, and generates path metrics and path selection signals at the respective nodes from the generated branch metrics.

The traceback memory 101 stores the path selection signals outputted from the ACS unit 100, and it is constituted by, for example, an ordinary RAM (Random Access Memory).

The maximum likelihood path judgment unit 102 judges a maximum likelihood path on the basis of the path metrics and the path selection signals outputted from the ACS means 100.

The termination timing detection unit 103 detects a termination processing period of the inputted code when it is traced back, from the signal indicating that the inputted convolution code is a termination code.

The traceback unit 104 receives the path selection signal outputted from the traceback memory 101, the termination control signal 110, and the termination value, and performs traceback using a pointer for traceback.

The traceback unit 104 comprises a compulsion value generation unit 105 for generating a compulsion value to be input to a pointer unit 106 on the basis of the termination control signal 110 outputted from the termination timing detection unit 103 and the variable termination value, a pointer unit 106 comprising an FIFO (First In First Out memory) which receives the maximum likelihood path outputted from the maximum likelihood path judgment unit 102, a code outputted from a coding bit generation unit 108, and the compulsion value outputted from the compulsion value generation unit 105, and outputs a pointer for performing traceback, a selection unit 107 for reading a maximum likelihood path selection signal from the traceback memory 101 using the pointer outputted from the pointer unit 106, and a coding bit generation unit 108 for generating coding bits from the path selection signal outputted from the selection unit 107.

A LIFO (Last In First Out memory) 109 stores the coding bits outputted from the traceback unit 104, and outputs a result of decoding.

Figure 6:
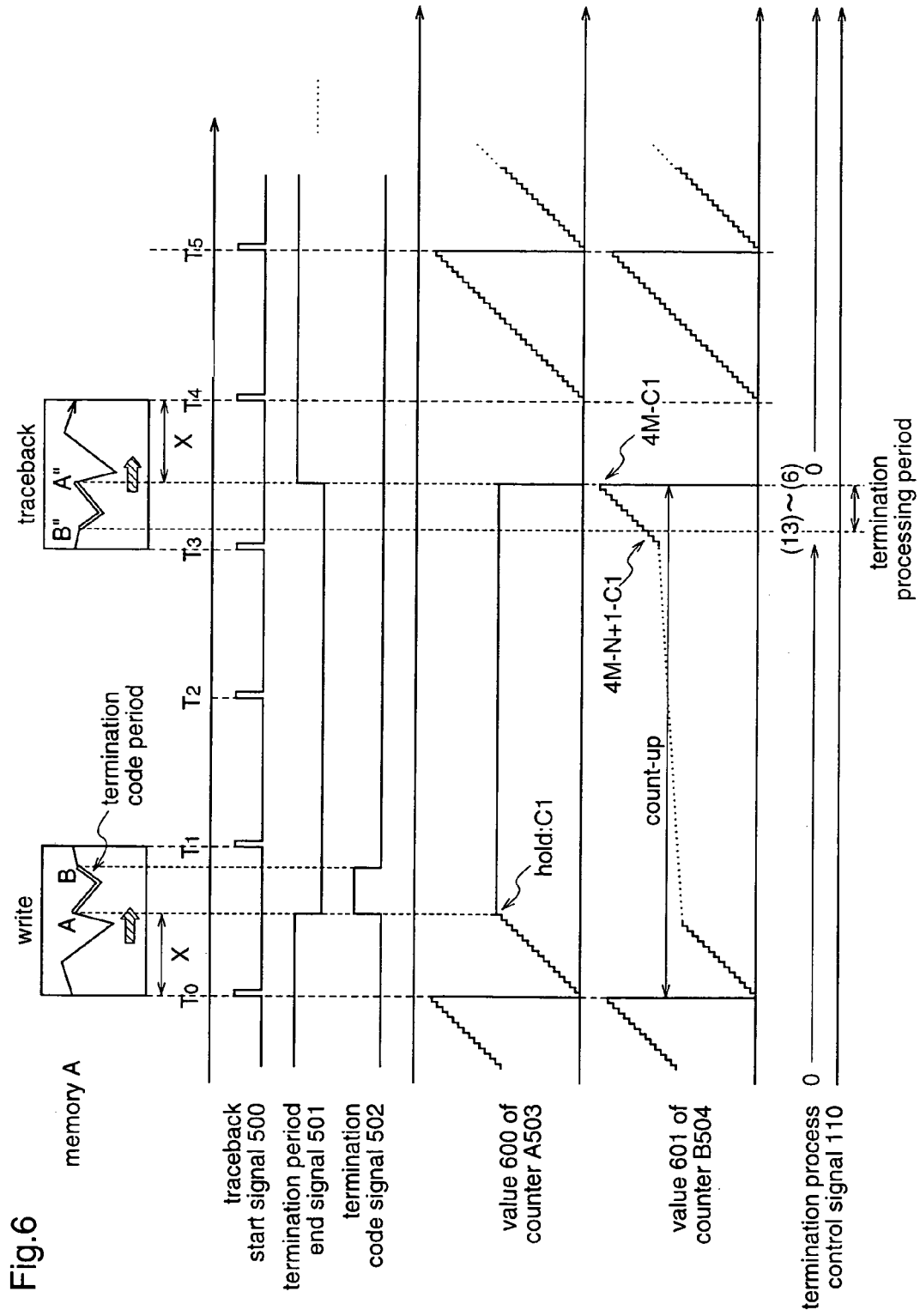
FIG. 6 is a timing chart of the traceback process according to the first embodiment of the present invention.

FIG. 6 shows a timing chart of the operation of the termination timing detection unit 103 constituted as described above.

A counter A 503 and a counter B 504 are started according to an AND obtained between a traceback start signal 500 that is generated at switching of the memories 101A, 101B, 101C, and 101D, and a termination period end signal 501 outputted from a termination process mode detection unit 505, and these counters perform counting for every symbol rate f. The value of the counter A is held as shown by 600 in FIG. 6 at a rising edge of a signal 502 indicating that the inputted convolution code is a termination code. Assuming that the value of the counter A at this time is C1, when the value C2 of the counter B shows 4M−C1−N+1~4M−C1 as shown by 601, the processing mode detection unit 505 generates and outputs a termination process control signal 110 indicating the states of (13)~(6).

The compulsion value generation unit 105 generates a compulsion value on the basis of the termination process control signal 110 and the inputted compulsion value.

Figure 7:
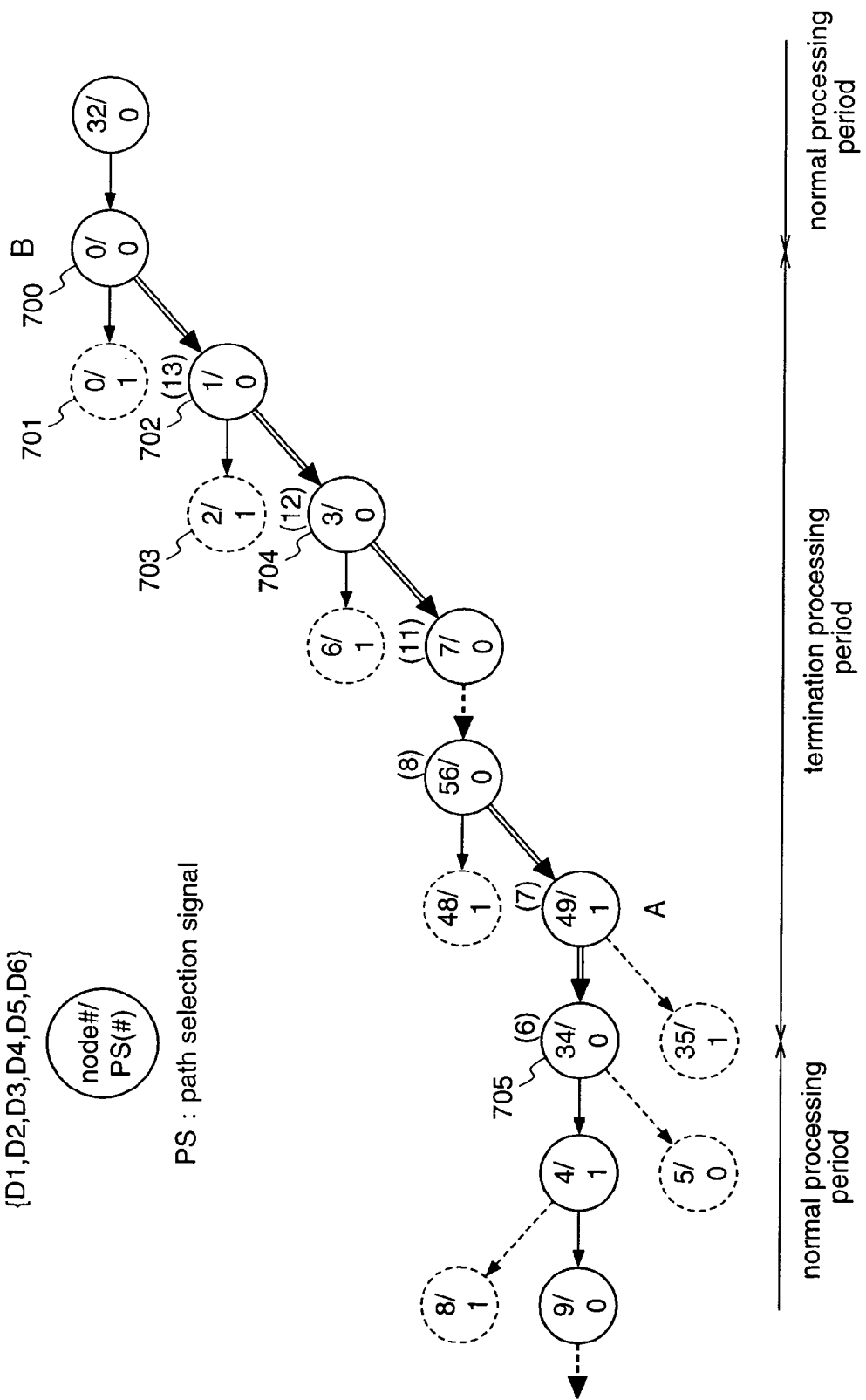
FIG. 7 is a flowchart of the traceback process according to the first embodiment of the present invention.

FIG. 7 is a flowchart illustrating nodes of a trellis diagram and path selection signals read from the traceback memory 101 during the termination processing period. Although a description will be given of a case where a node immediately before the termination processing period is in the state of {000000} and a termination value is 01000111, other states can be similarly explained.

Reference numeral 700 denotes a node immediately before the termination processing period, and indicates that the pointer unit 106 constituted by a FIFO is in the state of {000000}. At this node, the path selection signal taken out of the traceback memory 101 by the selection unit 104 is 0, and when normal traceback is carried out, the pointer unit 106 should transit to the state of {000000} indicated by a node 701 in FIG. 7. However, since the termination process control signal 110 outputted from the termination timing detection unit 103 shows the timing of (13), 1 is inputted as a compulsion value instead of the path selection signal, whereby the pointer 106 is led to the state of {000001} shown by 702 in FIG. 7. Since the path selection signal read at the node 702 is 0, the pointer 106 should transit to the state of {000010} shown by 703. However, since the termination process control signal 110 indicates (12), 1 is inputted as a compulsion value instead of the path selection signal, thereby to lead the pointer 16 to the state of {000011} shown by 704.

The above-mentioned processing is repeated during the termination processing period, whereby compulsion values corresponding to the times indicated by the termination process control signal 110 are generated and inputted to the FIFO of the pointer unit 106 instead of the taken path selection signals, thereby to lead the pointer unit 106 to the correct nodes, until reaching the state of {0100010} shown by 705 in which the processing goes to the next normal processing period. That is, in the period of (13)~(6), values of (13)1(12)1(11)1(10)0(9)0(8)0(7)1(6)0 which are obtained by back-to-front reversing the order of the termination code are inputted to the FIFO of the pointer unit 106.

As described above, since the pointer is controlled when inputting a termination code, deterioration in characteristics in a sequence having a high error rate is prevented from adversely affecting a sequence having a low error rate in a system whose reception characteristics are changed on reaching the termination code, whereby error correcting capability can be improved.

While the above description is given to the case where the termination value is 01000111, similar description can be made even when the termination value is variable. That is, in this case, the inputted termination value is held in the compulsion value generation unit 105, and a value in the order reverse to the termination value is inputted as a compulsion value to the FIFO on the basis of the termination process control signal 110, thereby performing processing similar to that described above.

While in this first embodiment the result outputted from the maximum likelihood path judgment unit 102 is used as a start pointer at start of traceback, an arbitrary fixed node may be selected as a start pointer, whereby the construction for using the result outputted from the maximum likelihood path judgment unit as a start pointer can be dispensed with, although the error correcting capability is somewhat sacrificed.

While in this first embodiment two counters are used, one counter and one counter value storage unit may be used. In this case, the value of the counter B 504 is stored in the storage unit by an AND obtained between the traceback start signal 500 and the termination period end signal 501 outputted from the termination process mode detection unit 505.

In the system where the termination value is a fixed value, a compulsion value based on the fixed value may be generated, whereby, in the compulsion value generation unit 105, inputting of a compulsion value and parts relating thereto can be dispensed with.

As described above, according to the Viterbi decoding apparatus of the first embodiment, a termination timing in a convolution code that is terminated with a predetermined termination value is detected, and a compulsion value obtained from the predetermined termination value is given to the traceback pointer in accordance with the reading timing of the traceback memory. Therefore, propagation of deterioration in error correcting capability before and after the termination code can be prevented without inviting a significant increase in circuit scale, resulting in highly precise Viterbi decoding.

Embodiment 2

Hereinafter, a Viterbi decoding apparatus according to a second embodiment of the present invention will be described.

Since the construction and operation of the Viterbi decoding apparatus of the second embodiment are identical to those of the first embodiment except the termination timing detection unit 103 and the compulsion value generation unit 105, repeated description is not necessary.

Further, since the operation of the Viterbi decoding apparatus of the second embodiment in the case where the termination period is not divided into two periods as shown in FIG. 4 is identical to that of the first embodiment, repeated description is not necessary.

Figure 8:
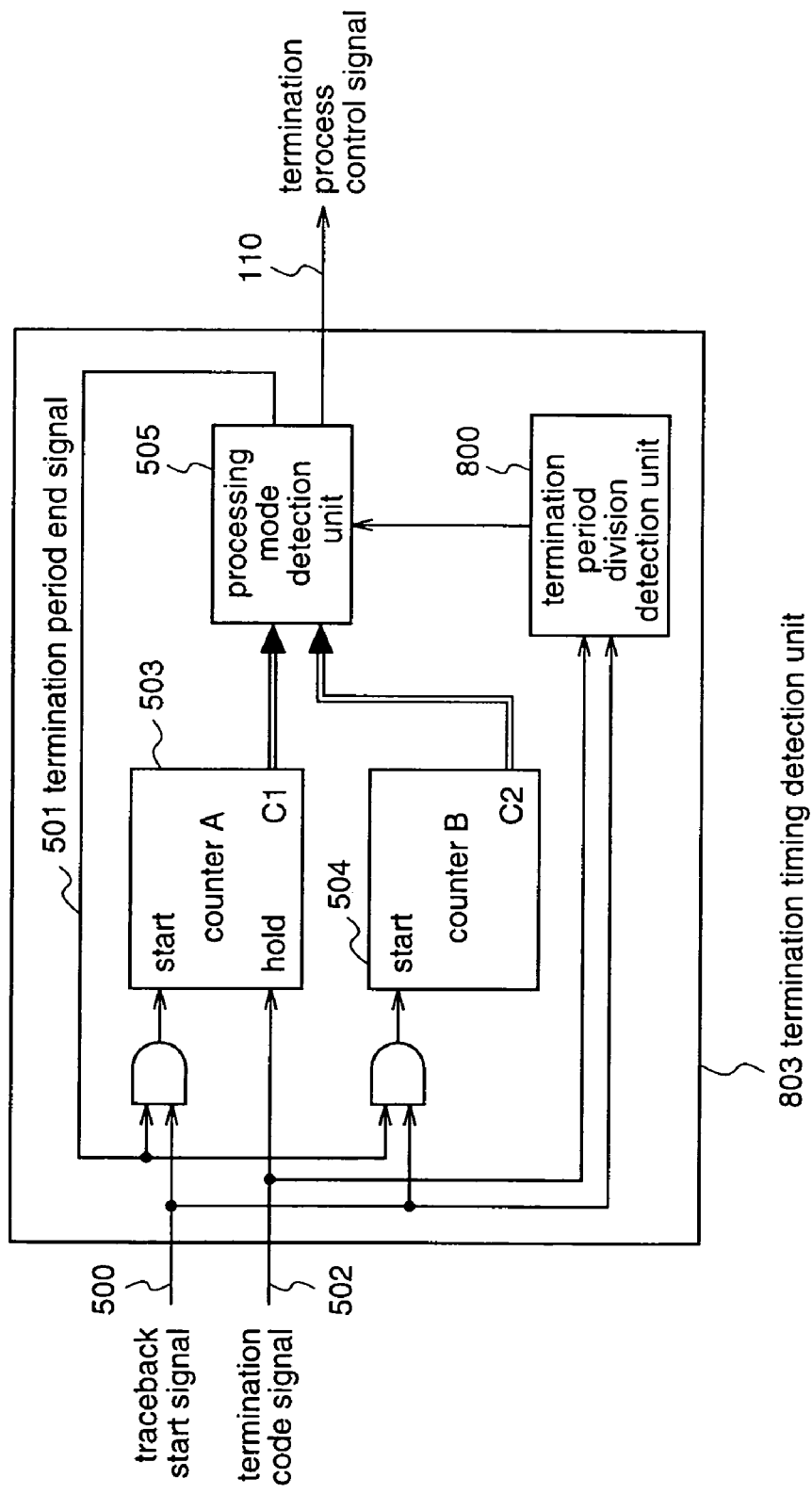
FIG. 8 is a block diagram of a termination timing detection unit according to a second embodiment of the present invention.

FIG. 8 is a block diagram illustrating a termination timing detection unit 803 according to the second embodiment.

The construction shown in FIG. 8 is obtained by adding a termination period division detection unit 800 to the termination timing detection unit 103 of the first embodiment. The process to be performed when the termination processing period is divided into two periods will be described for the case where, as shown in FIG. 9, the termination code is divisionally inputted to the memory 101A in period P~Q at time T0~T1−1 and to the memory 101B in period R~S at time T1~T2−1, respectively.

Figure 9:
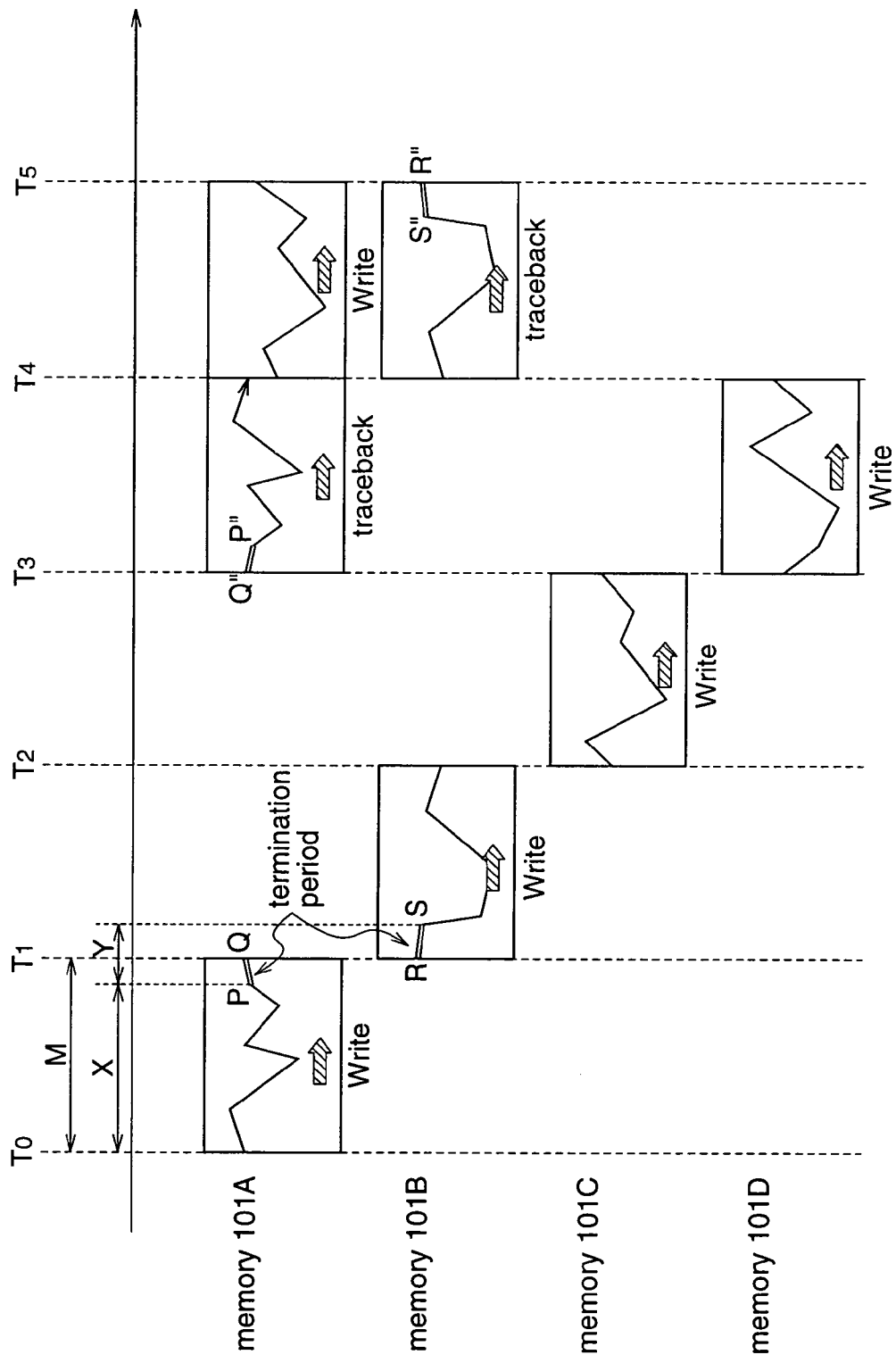
FIG. 9 is a conceptual diagram of a traceback process according to the second embodiment of the present invention.

As shown in FIG. 9, assuming that the times P, Q, R, and S are T0+X, T1−1, T1, and T0+X+Y, respectively, the times P″, Q″, R″, and S″ at which the path selection signals are taken out are T4−X, T3, T5−(X+Y−M), and T5−1, respectively, and the respective path selection signals are taken out after 4M−X, 3M, 6M−X−Y, and 5M−1 from T0. That is, if only the division of the termination period can be detected, the times at which the path selection signals of the termination code are taken out can be detected by obtaining X as in the case where the termination period is not divided.

Figure 10:
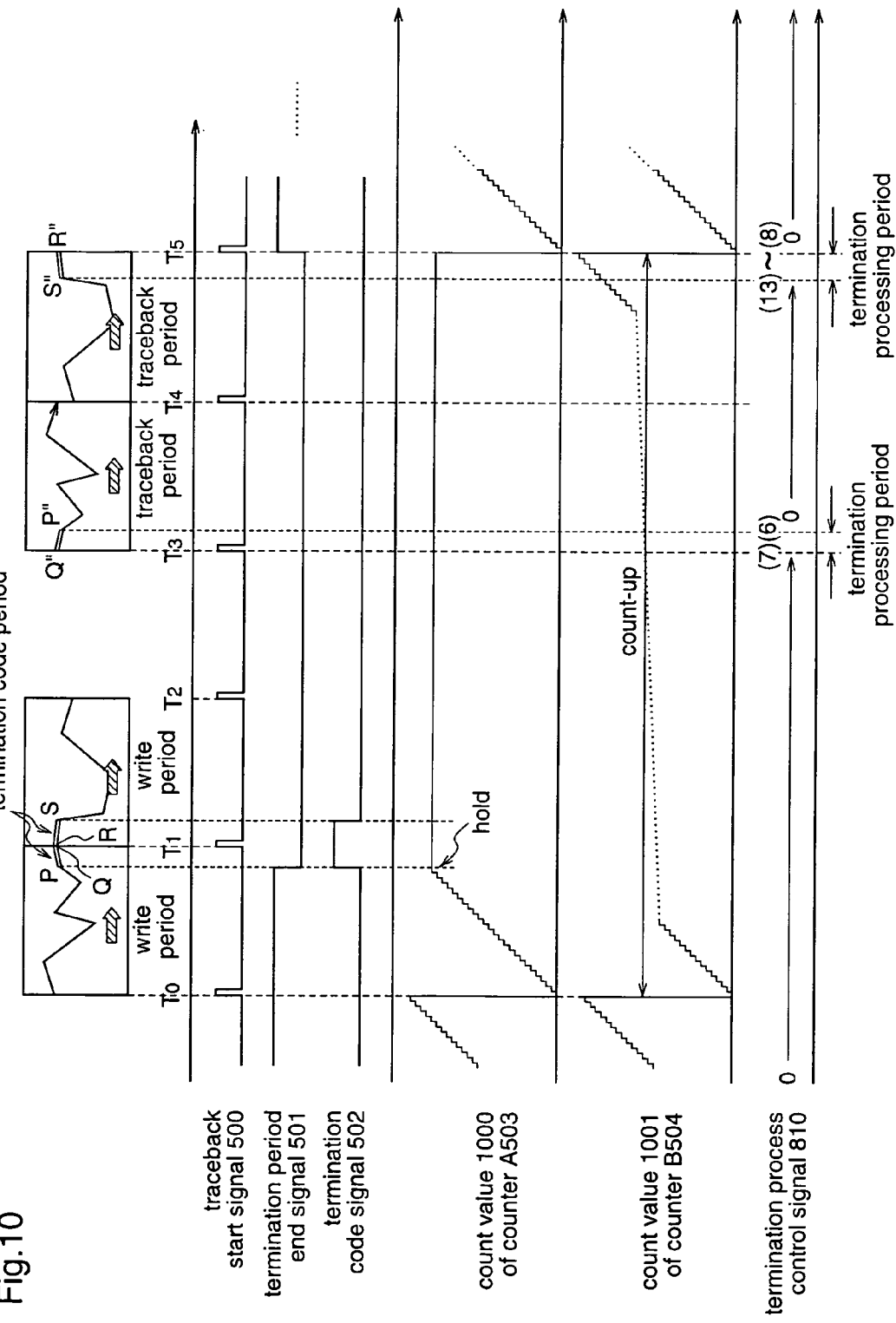
FIG. 10 is a timing chart of the traceback process according to the second embodiment of the present invention.

FIG. 10 shows a timing chart. The counter A503 and the counter B504 are started according to an AND obtained between the traceback start signal 500 generated at switching of the memories 101A, 101B, 101C, and 101D, and the termination period end signal 501 outputted from the termination process mode detection unit 505, and these counters perform counting for each symbol rate f. The value of the counter A503 is held as shown by 1000 with a termination code signal 502 indicating that the inputted convolution code is the head of the termination code. Thereafter, the termination period division detection unit 800 detects division of the termination period by that the traceback start signal 500 rises before the termination code signal 502 falls, and notifies the processing mode detection unit 505 of the division of the termination period.

When the division of the termination period is thus detected, the processing mode detection unit 505 generates and outputs termination process control signals 810 according to the period where the value C2 of the counter B504 is 3M~4M−C1 and the period where the value C2 is 5M−1~6M−N−C1, in the respective periods. In this second embodiment, the period of 3M~4M−C1 corresponds to the period of (7)~(6), and the period of 5M−1~6M−N−C1 corresponds to the period of (13)~(8). Further, when the state in the traceback start point at time Q″ is (1)~(5), a termination process control signal 801 is outputted also for this period.

The compulsion value generation unit 105 generates a compulsion value on the basis of the termination process control signal 810.

Figure 11:
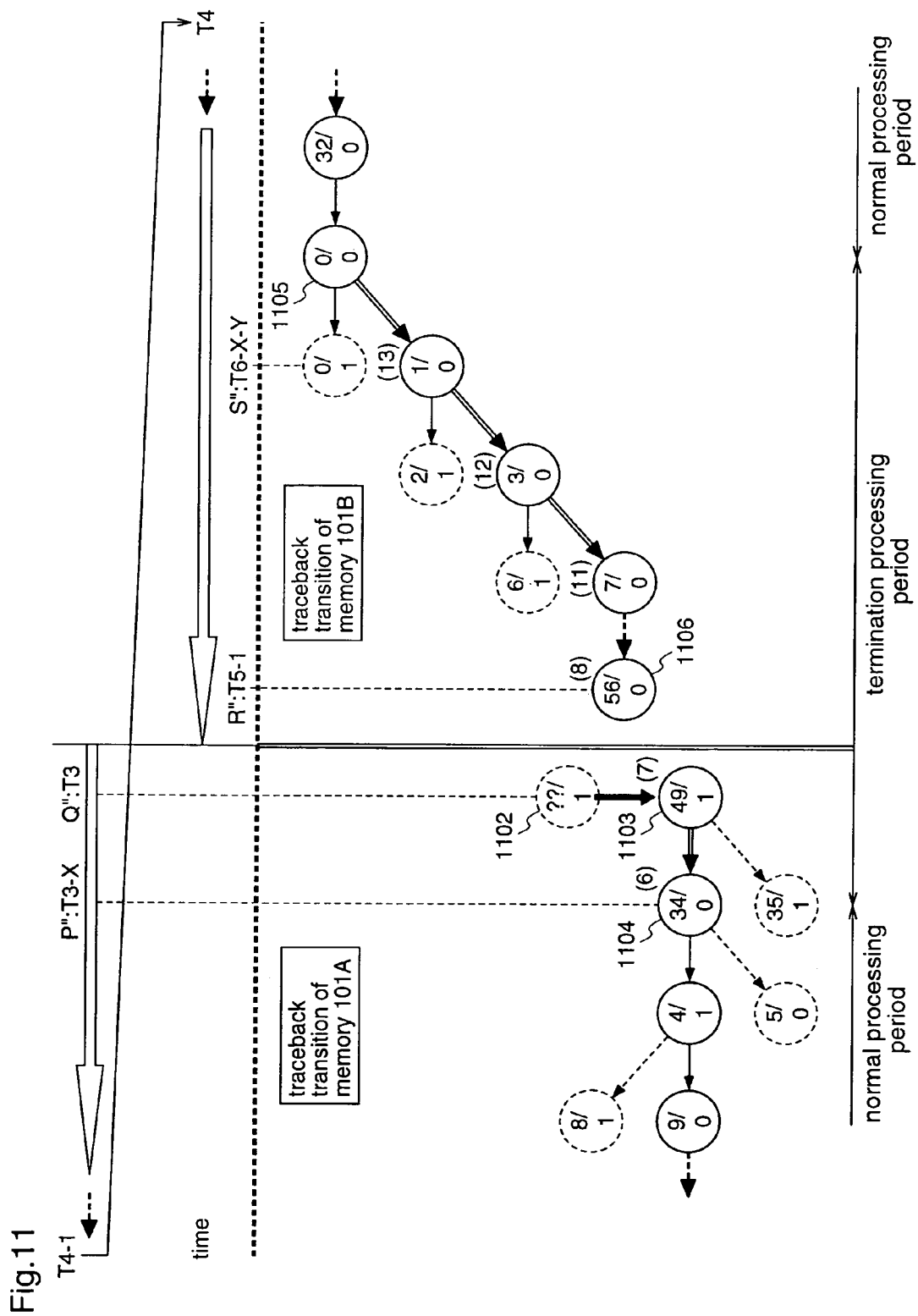
FIG. 11 is a flowchart of the traceback process according to the second embodiment of the present invention.

FIG. 11 is a flowchart illustrating nodes of a trellis diagram and path selection signals that are read from the traceback memory 101 during the termination processing period. In FIG. 11, traceback in the memory 101A at time T3~T4−1 is shown on the left side, and traceback in the memory 101B at time T4~T5 is shown on the right side.

With reference to FIG. 11, reference numeral 1102 denotes a node at start of traceback in time T3~T4−1, and usually, all bits of the pointer constituted by an FIFO are rewritten by the output of the maximum likelihood path judgment unit 102. In this process, when the termination process control signal 810 outputted from the termination timing detection unit 803 indicates the timing of (7), the state of {110001} is compulsorily given as shown by 1103 in FIG. 11 instead of the output of the maximum likelihood path judgment unit 102. When the state where not all the bits of the pointer are defined is the traceback start point, such as when the termination process control signal 810 outputted from the termination timing detection unit 803 indicates any of (13)~(8) and (5)~(1), a compulsion value is selected for only the defined bits while the output of the maximum likelihood path judgment unit 102 is used for the remaining bits. For example, in the case of (11), 111 is given as a compulsion value for the lower three bits, and the upper three bits abc of the output {abcdef} from the maximum likelihood path judgment unit 102 are used for the upper three bits, resulting in the state of {abc111}.

Thus, in the termination processing period P~Q in the traceback time T3~T4−1 by the memory 101A, a compulsion value generated on the basis of the termination process control signal 810 is used as an input to the FIFO instead of the path selection signal, as in the case where the termination period is not divided. That is, in this embodiment, the pointer 106 is led from the state of {110001} shown by 1103 in FIG. 11 to the state of {100010} shown by 1104. That is, in the period of (7)~(6), values of (7)1(6)0 which are obtained by back-to-front reversing the order of the first half portion of the termination code are given as an input to the FIFO of the pointer.

Next, also in the termination processing period R~S in the traceback time T4~T5−1 by the memory 101B, a compulsion value generated on the basis of the termination process control signal 810 is used as an input to the FIFO instead of the path selection signal. That is, in this embodiment, the pointer 106 is led from the state {000000} shown by 1105 in FIG. 12 to the state {111000} shown by 1106. That is, in the period of (13)~(8), values of (13)1(12)1(11)1(10)0(9)0(8)0 which is obtained by back-to-front reversing the order of the second half portion of the termination code are given as an input to the FIFO of the pointer 106.

While in this second embodiment the termination period is divided as shown in FIG. 9, the termination process control signal 810 varies depending on the manner of dividing the termination period and thereby the period and value of the compulsion value also vary. However, the operation is identical to that described above.

As described above, according to the Viterbi decoding apparatus of the second embodiment, even when the termination period is divided into two periods, setting of compulsion values to the respective periods is carried out considering that the termination code is divided. Therefore, the termination code can be correctly traced back, and error correcting capability can be further improved as compared with the first embodiment.

Embodiment 3

Hereinafter, a Viterbi decoding apparatus according to a third embodiment of the present invention will be described.

Since the third embodiment is identical to the second embodiment except the construction and operation of the termination timing detection unit, repeated description is not necessary.

Figure 12:
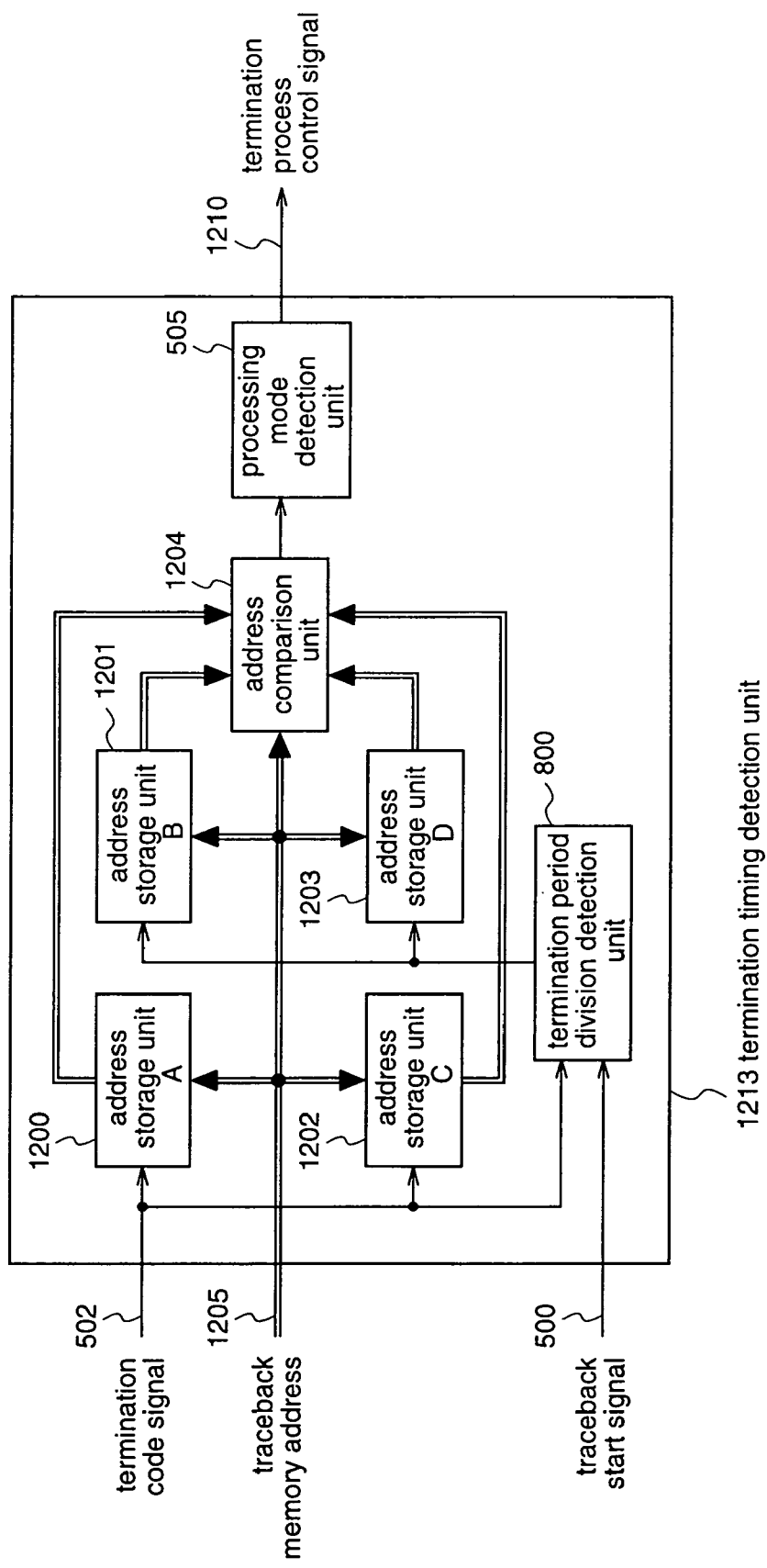
FIG. 12 is a block diagram of a termination timing detection unit according to a third embodiment of the present invention.

FIG. 12 shows the construction of a termination timing detection unit 1213 according to the third embodiment.

Reference numerals 1200~1203 denote address storage units A~D that hold write addresses at desired timings to the traceback memory 101 that stores termination codes.

Reference numeral 1204 denotes an address comparison unit which checks matching between the addresses of the traceback memory 101 and the addresses stored in the address storage units A~D.

Reference numeral 1215 denotes a processing mode detection unit for generating a termination process control signal 1210 from the output of the address comparison unit 1204.

A description will be given of the operation of the termination timing detection unit 1213 constituted as described above.

The operation of the termination timing detection unit 1213 in the case where a termination code is inputted to the traceback memory 101 with the termination period being divided as shown in FIG. 9 will be described with reference to the timing chart of FIG. 10.

The address storage unit A 1200 stores a write address AD_p of the traceback memory 101 at a rising edge (time P) of a termination code signal 502. The address storage unit B 1201 stores a write address AD_q of the traceback memory 101 at a rising edge (time Q) of a traceback start signal 1212. The address storage unit C 1202 stores a write address AD_r of the traceback memory 101 at a falling edge (time R) of the traceback start signal 500. The address storage unit D 1203 stores a write address AD_s of the traceback memory 101 at a falling edge (time S) of the termination code signal 502.

In the address comparison unit 1205, the addresses AD_p~AD_s stored in the address storage units A~D as mentioned above are compared with a read address AD_m of the traceback memory 101, and it is detected that the path selection signals that have been written at the respective times P~S are read, by confirming matching of the stored addresses and the read address after the storage. That is, the AD_m is compared with the AD_p, and the time at which the AD_m matches the AD_p after the storage of the AD_p is P". Likewise, the AD_is compared with the AD_q~AD_s, and the times at which the AD_m matches the AD_q~AD_s after the storage of the AD_q~AD_s are Q"~S", respectively.

Based on the times detected by the address comparison unit 1205, the processing mode detection unit 1215 outputs a termination process control signal 1210 indicating the states of (13)~(6) to the compulsion value generation unit 105, as in the second embodiment. When the traceback start point is (5)~(1), a termination process control signal 1210 for this period is also outputted to the compulsion value generation unit 105.

Thereafter, the same processes as described for the second embodiment are carried out, thereby improving error correcting capability as in the second embodiment.

If the process in the case where the termination period is divided is not considered, the construction and operation of the address storage unit A 1200 can be reduced by somewhat sacrificing improvement in error correcting capability.

When the addresses of the traceback memory 101 at start and end of traceback are fixed and the address comparison unit 1204 uses the fixed values instead of the storage addresses of the address storage unit B 1201 and the address storage unit C 1202, the constructions and operations of the address storage unit B 1201 and the address storage unit C 1202 can be reduced.

According to the above-described Viterbi decoding apparatus of the third embodiment, the termination timing detection means is provided with the address storage means for storing, when the termination period is separated into two banks, the addresses for writing the head value of the termination code in the first bank, the last value of the termination code in the first bank, the head value of the termination code in the second bank, and the last value of the termination code in the second bank, respectively, and the stored write addresses are compared with the address for reading the traceback memory to detect the termination processing period, and the traceback unit sets a compulsion value based on the termination value on the pointer during the detected period. Therefore, propagation of deterioration in error correcting capability before and after the termination code can be avoided, resulting in highly precise Viterbi decoding.

Embodiment 4

Hereinafter, A Viterbi decoding apparatus according to a fourth embodiment of the present invention will be described.

Since the fourth embodiment is identical to the second embodiment except the constructions and operations of the traceback memory and the termination timing detection unit, repeated description is not necessary.

Figure 13:
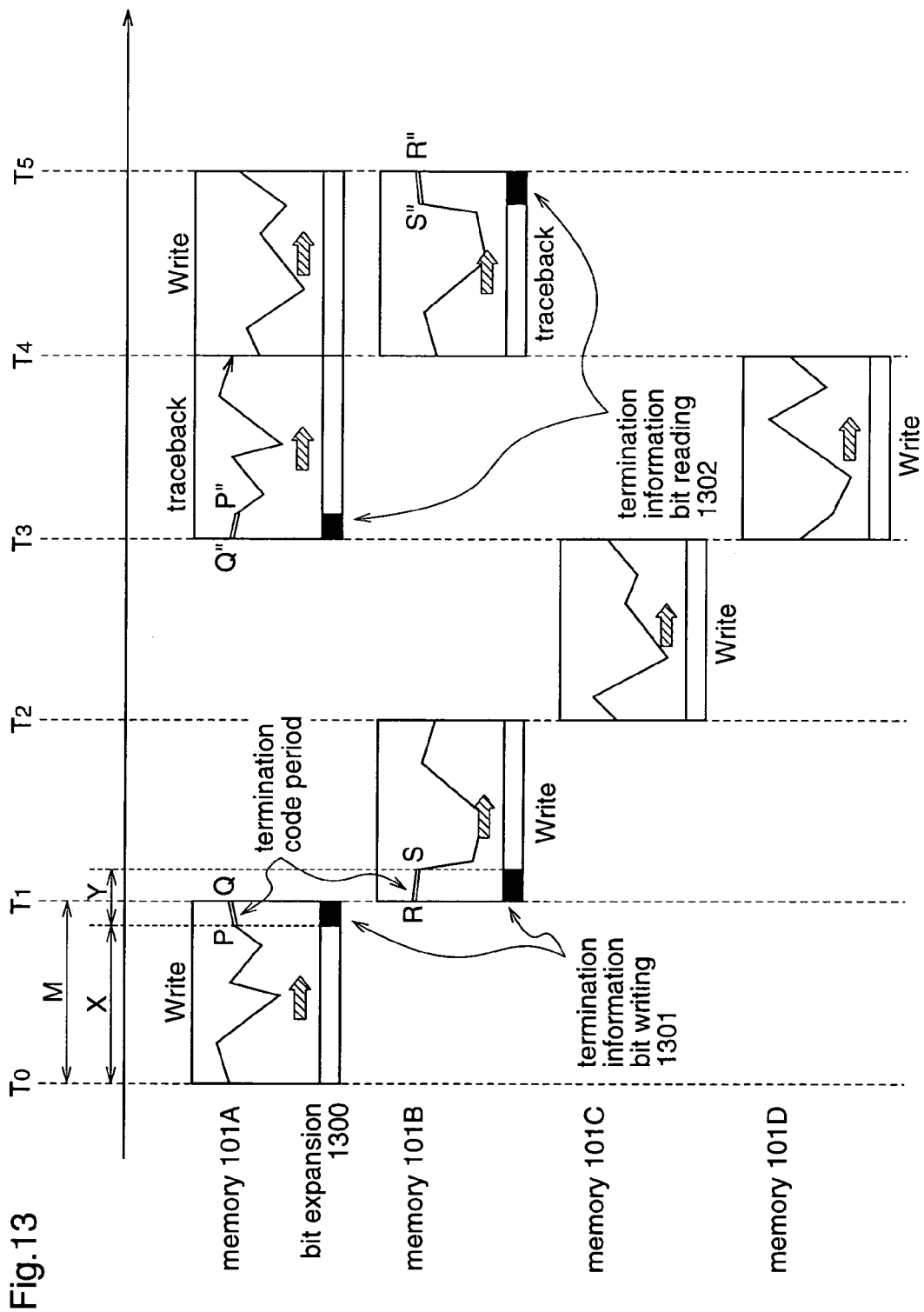
FIG. 13 is a conceptual diagram of a traceback process according to a fourth embodiment of the present invention.

As shown by bit expansion 1300 in FIG. 13,. the number of bits of the traceback memory 101 is expanded by the number of termination information bits in the above-mentioned embodiments, and when a path selection signal due to a termination code is stored in the traceback memory 101 in addition to the storage of the conventional path selection signal, the information of (1)~(13) indicating the termination states are successively stored as shown by termination information bit writing 1301. In this fourth embodiment, the traceback memory 101 is expanded by four bits for the termination information bits in addition to the number of bits of the path selection signal, and the information of (1)~(13) are stored in the traceback memory 101.

Further, as shown by termination information bit reading 1302, when reading the path selection signals during traceback, the termination information bits are read simultaneously, and the read termination information bits are used in like manner as the termination process control signals 810 and 1210 in the second and third embodiments, whereby detection of the termination timing can be carried out without using the termination timing detection units 803 and 1213 in the second and third embodiments, respectively.

Thereafter, the same processes as described for the second or third embodiment are carried out, thereby improving error correcting capability as in the second embodiment.

While in this fourth embodiment (1)~(13) indicating the termination states are stored in the traceback memory as 4-bit termination information, the 4-bit termination information indicating the termination states can be converted to 1-bit information indicating that the inputted code is a termination code by operating a counter simultaneously with start of recording into the traceback memory 101, detecting, when the termination period is divided, how many steps by which the termination period is divided from the counter value, and performing processing in accordance with the manner of the division by the compulsion value generation unit 105 as in the second and third embodiments. Thereby, reduction in the memory can be achieved.

As described above, according to the Viterbi decoding apparatus of the fourth embodiment, when the termination timing detection means writes a convolution code that is terminated with a predetermined termination value into the traceback memory, the termination timing detection means writes judgment data comprising plural bits or one bit indicating that this code is a termination code into the traceback memory together with the convolution code, reads the judgment data simultaneously with the convolution code, judges the termination period using the judgment data, and sets a compulsion value based on the termination value to the pointer during the detected period. Therefore, propagation of deterioration in error correcting capability before and after the termination code can be avoided as described in the first to third embodiments, whereby highly precise Viterbi decoding can be carried out.

Embodiment 5

Hereinafter, a Viterbi decoding apparatus according to a fifth embodiment of the present invention will be described.

While the first to fourth embodiments relate to traceback by a pipeline process using a traceback memory comprising plural banks, in this fifth embodiment, processing is carried out using a traceback memory comprising a single bank by accessing the traceback memory at a reading rate M times as high as a writing rate of an input code. Since this fifth embodiment is identical to the fourth embodiment except the timing and number of times of the traceback process, repeated description is not necessary.

The operation according to the fifth embodiment will be described with reference to FIG. 14.

Figure 14:
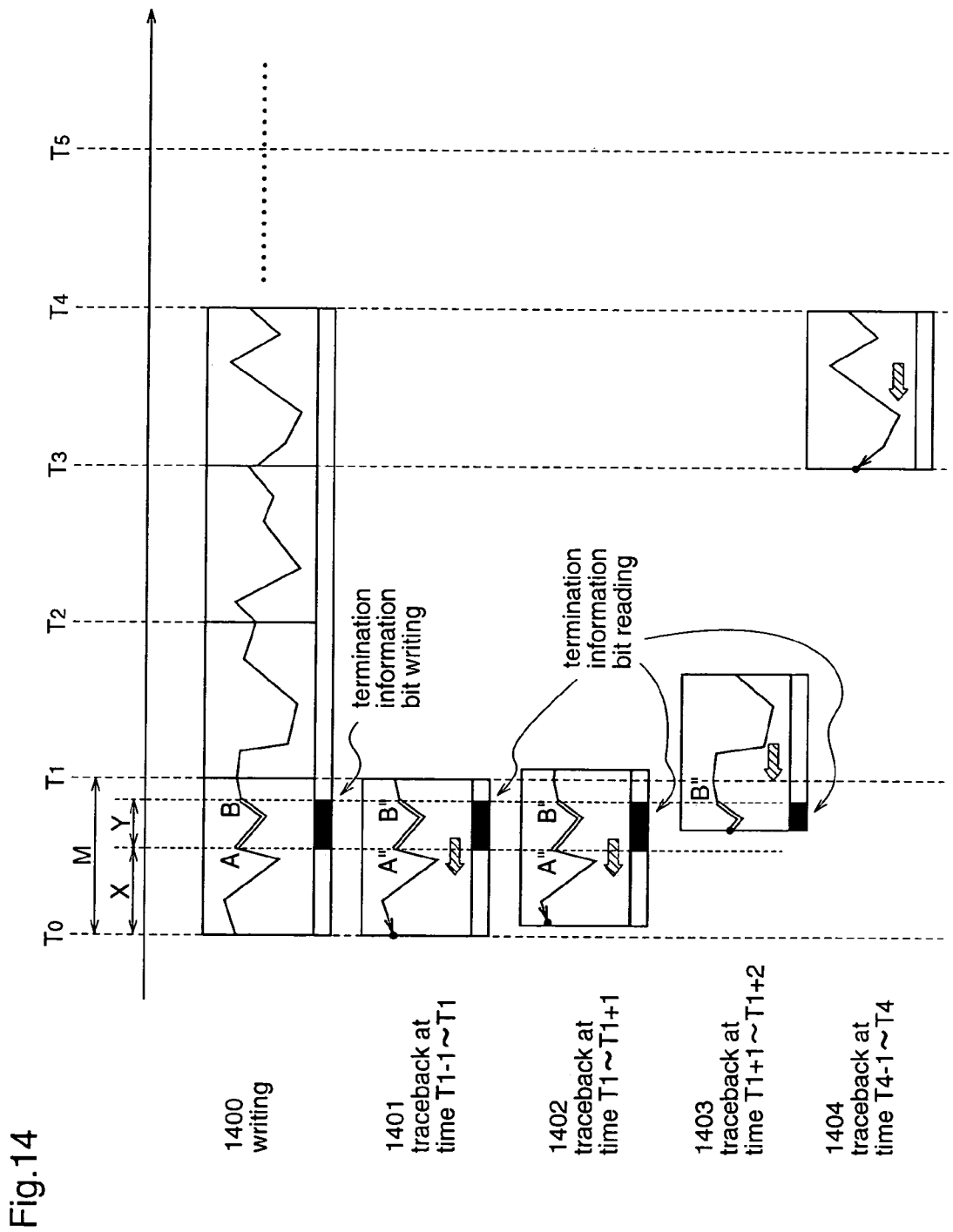
FIG. 14 is a conceptual diagram of a traceback process according to a fifth embodiment of the present invention.

As shown by 1400 in FIG. 14, path selection signals are stored from time T0 into the traceback memory comprising a single bank, and as shown by 1401, traceback is carried out using the path selection signals stored in time T0~T1−1, during a period from time T1−1 when M pieces of signals are written to time T1 when a next path selection signal is to be written, thereby decoding the convolution code at the timing when the path selection signal was written at time T0.

Further, at time T1, a path selection signal due to a next convolution code is written in the address where the path selection was stored at time T0 when the convolution code has just been decoded, and as shown by 1402, traceback is carried out using the path selection signals stored in time T0+1~T1, during a period from time T1 to time T1+1 when a next path selection signal is to be written, thereby decoding the convolution code at the timing when the path selection signal was written at time T0+1.

Further, at time T1+1, a path selection signal due to a next convolution code is written in the address where the path selection signal was stored at time T0+1 when the convolution code has just been decoded, and as shown by 1403, traceback is carried out using the path selection signals stored in time T0+2~T1+1, during a period from time T1+1 to time T1+2 at which a next pass selection signal is to be written, thereby decoding the convolution code at the timing when the path selection signal was written at time T0+2.

The above-mentioned processes are repeated to perform decoding for every symbol rate, and the outputted decoded codes become decoding results as they are without passing through the LIFO.

In the above-mentioned traceback process, when the input code is a termination code, the termination information bits are stored in the traceback memory as described for the fourth embodiment, and a compulsion value is generated on the basis of this information and used instead of the path selection signal as described for the first to fourth embodiments, whereby error correcting capability can be further improved.

The Viterbi decoding apparatus according to the fifth embodiment does not perform traceback by a pipeline processing using a traceback memory comprising plural banks but performs traceback using a traceback memory comprising a single bank by accessing the traceback memory at a reading rate M times as high as a writing rate of the input code. Therefore, as in the first to fourth embodiments, the termination information bits are stored into the traceback memory and a compulsion value is generated on the basis of the termination information bits and used instead of the path selection signal, whereby propagation of deterioration in error correcting capability before and after the code can be avoided, resulting in highly precise Viterbi decoding.

Applicability In Industry

A Viterbi decoding apparatus and a Viterbi decoding method according to the present invention can avoid deterioration in error correcting capability in decoding a terminated convolution code, and therefore, they are useful as a demodulation circuit and a demodulation method for a digital television.

The invention claimed is:

1. A Viterbi decoding apparatus for decoding a convolution code that is terminated by a predetermined termination value, comprising:
an ACS means for generating a branch metric from an inputted code to generate a path metric and a path selection signal at each node;
a traceback memory for storing the path selection signal outputted from the ACS means;
a termination timing detection means for detecting a termination timing of the inputted code, and outputting a termination control signal for controlling a traceback process to be performed to the traceback memory; and
a traceback unit for receiving the path selection signal outputted from the traceback memory, and the termination control signal, and performing the traceback process using a pointer for traceback;
wherein said traceback unit sets a compulsion value based on the termination value to the pointer, independently of the path selection signal, when the termination control signal indicates a termination processing period.

2. A Viterbi decoding apparatus as defined in claim 1 wherein
said termination timing detection means includes a counter means for performing counting every time code data is inputted, and obtains the termination code period by calculation from a counter value of the counter means, at a timing when the convolution code terminated with a predetermined termination value is written into the traceback memory, and
said traceback unit sets a compulsion value based on the termination value to the pointer in the detected termination code period, for performing the traceback process.

3. A Viterbi decoding apparatus as defined in claim 1 further including
means for setting, when a code sequence in which a termination value is variable is inputted, a variable value according to the termination value as a compulsion value,
wherein said traceback unit compulsorily sets the compulsion value according to the variable termination value on the traceback pointer, when the termination timing detection means detects the termination period.

4. A Viterbi decoding apparatus as defined in claim 1 including
said traceback pointer comprising an FIFO (First In First Out), and
means for inputting a compulsion value as input bits to the FIFO independently of the path selection signal, during the termination processing period detected by the termination timing detection means,
wherein said traceback unit sets a compulsion value based on the termination value to the pointer.

5. A Viterbi decoding apparatus as defined in claim 1 wherein
said termination period detection means detects and outputs only a partial period in a detected termination processing period or in a detected termination processing period that is divided into two periods, and
said traceback unit sets a compulsion value on the traceback pointer only in the partial period.

6. A Viterbi decoding apparatus as defined in claim 1 wherein said traceback unit accesses the traceback memory at a reading rate that is M (M: integer not less than 2) times as high as a writing rate of the inputted code to perform the traceback process.

7. A Viterbi decoding apparatus as defined in claim 2 wherein
said termination timing detection means includes
means for writing, into the traceback memory, 1-bit judgment data indicating that the convolution code terminated with a predetermined terminal value is a termination code, together with the convolution code, when the convolution code is written in the traceback memory,
means for reading the judgment data simultaneously with the convolution code, and
means for judging the termination period using the judgment data, and
said traceback unit sets a compulsion value based on the termination value to the pointer in the detected period.

8. A Viterbi decoding apparatus as defined in claim 2 wherein
said termination timing detection means includes
means for writing, into the traceback memory, judgment data comprising plural bits which indicates the termination state of the convolution code terminated with a predetermined terminal value, together with the convolution code, when the convolution code is written in the traceback memory, and
means for reading the judgment data simultaneously with the convolution code from the traceback memory, and
said traceback unit sets a compulsion value based on the termination value to the pointer at a timing when the judgment data is read.

9. A Viterbi decoding apparatus as defined in claim 1 wherein
said traceback memory comprises a plurality of banks,
said traceback unit performs the traceback process by a pipeline processing, using the traceback memory that is divided into the plural banks,
when the termination value is separated into two banks, said termination timing detection means detects termination code periods of the two banks or a termination code period of one of the two banks, and
said traceback unit sets the compulsion value based on the termination value to the pointer, in the two termination code periods or in the one of the two termination code periods, for performing the traceback process.

10. A Viterbi decoding apparatus as defined in claim 9 wherein
said termination timing detection means includes a counter means that performs counting every time code data is inputted, and a termination period division detection means for detecting that the termination code period is divided into two periods, on the basis of a traceback start signal and a termination code signal, and obtains the one termination code period or the termination code period that is detected as being divided into two periods, by calculation from a counter value of the counter means, at a timing when a convolution code terminated with a predetermined termination value is written into the traceback memory; and
said traceback means sets a compulsion value based on the termination value to the pointer in the detected termination code period.

11. A Viterbi decoding apparatus as defined in claim 9 wherein
said termination timing detection means includes one address storage means for storing an address for writing a head value of the convolution code terminated with a predetermined termination value into the traceback memory, and compares the stored write address with an address for reading the traceback memory to detect the termination processing period, and
said traceback means sets a compulsion value based on the termination value to the pointer, in the detected termination code period.

12. A Viterbi decoding apparatus as defined in claim 9 wherein
said termination timing detection means includes
an address storage means that stores, when the termination period is separated into two banks, an address for writing a head value of the termination code in the first bank,
an address storage means that stores an address for writing a last value of the termination code in the first bank,
an address storage means that stores an address for writing a head value of the termination code in the second bank,
an address storage means that stores an address for writing a last value of the termination code in the second bank, and
an address comparison means for comparing the stored write addresses with the address for reading the traceback memory to detect the termination processing period, and
said traceback unit sets a compulsion value based on the termination value to the pointer in the detected termination code period.

13. A Viterbi decoding apparatus as defined in claim 9 wherein
addresses for traceback start and end in the traceback memory are fixed,
said termination timing detection means includes
an address storage means that stores an address for writing a head value of the termination code in the first bank,
an address storage means that stores an address for writing a head value of the termination code in the second bank, and
an address comparison means for comparing the stored write addresses with an address for reading the traceback memory to detect the termination processing period, and
said traceback unit sets a compulsion value based on the termination value to the pointer in the detected period.

14. A Viterbi decoding apparatus as defined in claim 9 wherein
said termination timing detection means includes a counter means for performing counting every time code data is inputted, and obtains the termination code period by calculation from a counter value of the counter means, at a timing when the convolution code terminated with a predetermined termination value is written into the traceback memory, and
said traceback unit sets a compulsion value based on the termination value to the pointer in the detected termination code period, for performing the traceback process.

15. A Viterbi decoding apparatus as defined in claim 9 wherein
said termination timing detection means includes
means for writing, into the traceback memory, 1-bit judgment data indicating that the convolution code terminated with a predetermined terminal value is a termination code, together with the convolution code, when the convolution code is written in the traceback memory,
means for reading the judgment data simultaneously with the convolution code, and
means for judging the termination period using the judgment data, and
said traceback unit sets a compulsion value based on the termination value to the pointer in the detected period.

16. A Viterbi decoding apparatus as defined in claim 9 wherein
said termination timing detection means includes
means for writing, into the traceback memory, judgment data comprising plural bits which indicates the termination state of the convolution code terminated with a predetermined terminal value, together with the convolution code, when the convolution code is written in the traceback memory, and
means for reading the judgment data simultaneously with the convolution code from the traceback memory, and
said traceback unit sets a compulsion value based on the termination value to the pointer at a timing when the judgment data is read.

* * * * *